(12) United States Patent
Aiello et al.

(10) Patent No.: US 6,518,139 B1
(45) Date of Patent: Feb. 11, 2003

(54) POWER SEMICONDUCTOR DEVICE STRUCTURE WITH VERTICAL PNP TRANSISTOR

(75) Inventors: Natale Aiello, Catania (IT); Davide Patti, Catania (IT); Salvatore Scaccianoce, Riposto (IT); Salvatore Leonardi, Aci Sant'antonio (IT)

(73) Assignee: CO.RI.M.ME Consorzio per la Sulla Microelectronica nel Mezzogiorno, Catania (IT)

( * ) Notice: Subject to any disclaimer, the term of this patent is extended or adjusted under 35 U.S.C. 154(b) by 0 days.

(21) Appl. No.: 09/569,277

(22) Filed: May 11, 2000

Related U.S. Application Data

(62) Division of application No. 08/858,868, filed on May 19, 1997, now abandoned.

(30) Foreign Application Priority Data

May 21, 1996 (EP) .............................................. 96830293

(51) Int. Cl.[7] .................. H01L 21/8224; H01L 21/8228
(52) U.S. Cl. ........................ 438/322; 438/327; 438/336; 438/340; 438/357; 438/370
(58) Field of Search ................................. 438/203–205, 438/208, 322, 324–327, 336, 340, 356–357, 370

(56) References Cited

U.S. PATENT DOCUMENTS 4,898,836 A * 2/1990 Zambrano et al. .......... 438/322
6,127,723 A * 10/2000 Aiello et al. ................ 257/582

FOREIGN PATENT DOCUMENTS

| EP | 0322040 | 12/1988 | ........... H01L/21/82 |
| EP | 0 403 449 | 6/1990 | ........... H01L/27/06 |
| GB | 2169444 A | 7/1986 | ........... H01L/21/38 |

OTHER PUBLICATIONS

Buss et al., *IEE International Solid–State Circuits Conference*, (Feb. 14, 1990), pp. 248–249, 305, XP000201956, "A 10A Automotive High–Side Switch".

* cited by examiner

*Primary Examiner*—Carl Whitehead, Jr.
*Assistant Examiner*—Toniae M. Thomas
(74) *Attorney, Agent, or Firm*—Allen, Dyer, Doppelt Milbrath & Gilchrist, P.A.; Lisa K. Jorgenson

(57) ABSTRACT

A power semiconductor device structure formed in a chip of semiconductor material includes an N-type substrate and an N-type epitaxial layer. The structure comprises a P-type insulation region which forms a pocket in which control circuitry is formed, and a plurality of fully insulated PNP power transistors. Each PNP power transistor comprises a P-type collector region including of a buried region between the substrate and the epitaxial layer and a contact region. The P region delimits a base N region within which an emitter P region is formed.

9 Claims, 4 Drawing Sheets

POWER SEMICONDUCTOR DEVICE STRUCTURE WITH VERTICAL PNP TRANSISTOR

This application is a division of Ser. No. 08/858,868 filed on May 19, 1997 the disclosures of which are hereby incorporated by reference in their entirety.

FIELD OF THE INVENTION

The present invention relates to a semiconductor device structure, and in particular, but not exclusively, to a power semiconductor device structure.

BACKGROUND OF THE INVENTION

In the technology of integrated circuits of the mixed type, the signal control or processing circuits together with the power transistors capable of driving loads at high voltage and/or high current are integrated on the same chip of semiconductor material. The transistors of the control circuitry are low-voltage transistors, with a collector-base, open emitter breakdown voltage ($BV_{cbo}$) which is typically between 20 and 50 V. The power transistors have a breakdown voltage generally greater than 50 V and withstand maximum currents between a few hundredths of a milliampere and a few tens of amperes. An example of a technology of integrated circuits of the mixed type is the VIPower technology (VIPower is a trade mark of SGS-Thomson Microelectronics S.r.l.), described, for example, in European Patent Application EP-322040 filed by SGS-Thomson Microelectronics S.r.l.

In certain applications it is necessary to have PNP-type power transistors, for example, in applications of the "high side driver" type, in which the emitter terminal of the PNP power transistor is connected to the positive terminal of a power source (V d.c.), while the collector terminal drives a load having the other terminal connected to a reference terminal (earth or ground) which is connected to the negative terminal of the power source.

An example of a PNP transistor made with VIPower technology and usable in such a configuration is described in "Vertical PNP transistors for Power ICs in high side driver applications", R. Zambrano—ENE-MAUEN, Florence, 1991. Technologies of the mixed type in the known art impose an upper limit on the maximum voltage applicable to PNP power transistors. The breakdown voltage of PNP power transistors is generally less than 100 V, which considerably restricts the range of application of known devices.

SUMMARY OF THE INVENTION

This disadvantage of the known art of imposing an upper limit or the maximum voltage applicable to power transistors is avoided by the present invention. The present invention provides a structure of a power semiconductor device comprising at least one PNP power transistor and control circuitry of the PNP power transistor. The structure is formed in a chip of semiconductor material comprising, between a first and a second surface, an N-type substrate and an N-type epitaxial layer, and is characterized in that it comprises at least a first P-type region comprising a first buried region between the substrate and the epitaxial layer, and a first contact region extending from the second surface to the first buried region. The first region and the second surface delimit a first portion of the epitaxial layer containing the control circuitry. At least one second P-type region comprising a second buried region between the substrate and the epitaxial layer and a second contact region extends from the second surface to the second buried region. The second region and the second surface delimit a second portion of the epitaxial layer. A third P-type region extends from the second surface to the interior of the second portion of the epitaxial layer. The second region, the second portion of the epitaxial layer and the third region contain, respectively, the collector, base and emitter regions of the PNP power transistor. This structure may be used to make a vertical current-conducting PNP power transistor having a high breakdown voltage, typically greater than 200 V.

The structure according to the present invention also offers the advantage, for example with respect to the structures formed with the VIPower technology, of using a single epitaxial layer, with a consequently greater simplicity of the corresponding manufacturing process. The process according to the present invention makes it possible to form in a simple way a plurality of PNP power transistors integrated on the same chip and fully insulated electrically from each other. This makes it possible to form different power stages, with a plurality of independent terminals, on the same chip.

BRIEF DESCRIPTION OF THE DRAWINGS

Different embodiments of the present invention will now be described by way of example, with reference to the attached drawings in which.

DETAILED DESCRIPTION OF THE PREFERRED EMBODIMENTS

Figure 1:
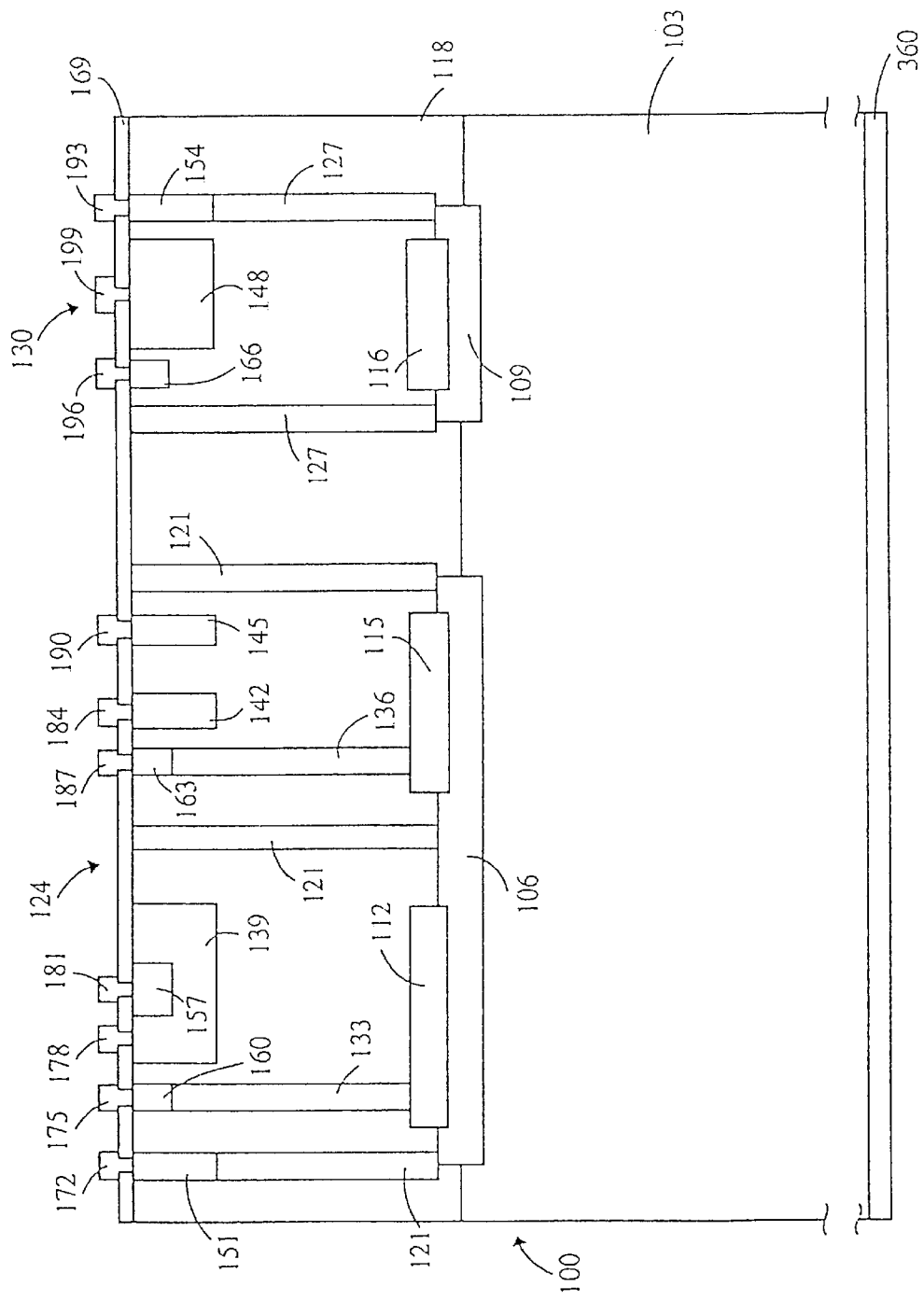
FIG. 1 is a partial schematic sectional view of a first embodiment of the semiconductor device structure according to the present invention.

With reference to the figures, and in particular with reference to FIG. 1, a schematic sectional view of a first embodiment of the semiconductor device structure according to the present invention is provided. The structure is formed in a chip of semiconductor material 100 comprising a substrate 103, typically made of single crystal silicon, doped with N-type impurities. The substrate 103 has a concentration of impurities and a thickness selected suitably according to the value of the maximum operating voltage of the device which is to be made. Typically, the concentration of the N-type impurities varies between $1 \times 10^{13}$ and $5 \times 10^{13}$ atoms per $cm^3$, while the thickness of the substrate 103, which on completion of the process has the above concentration, is generally between 50 µm and 100 µm.

P-type regions are formed on the upper surface of the substrate 103 by implantation and subsequent diffusion. In particular, on completion of the process, a P-type region 106 forms a buried insulating region for the control circuitry, while a P-type region 109 forms a buried collector region of the PNP power transistor.

Regions with N-type doping are then formed on these P-type regions by subsequent phases of implantation and diffusion. In the example shown in the figure, on completion of the process, an N-type region 112 forms a buried collector region of a vertical NPN control transistor and an N-type region 115 forms a buried base region of a lateral PNP control transistor.

A layer 118 having the same type of conductivity as the substrate (N) is then formed by epitaxial growth on the upper surface of the substrate 103. In this phase, which takes place at high temperature, the P-type and N-type impurities implanted previously in the substrate are further diffused, producing the previously mentioned buried regions 106, 109, 112 and 115 between the substrate 103 and the epitaxial layer 118 which between them form buried P-N junctions.

In the epitaxial layer 118, P-type regions are then formed, by known techniques of masking, implanting and diffusion, these regions passing substantially through the whole epitaxial layer 118. In particular, the P-type regions 121 are connected to the P-type buried region 106 to complete an insulation region 106, 121 which delimits a portion (or pocket) 124 of the epitaxial layer 118 in which the control circuitry is formed. As shown in the figure, the pocket 124 is divided into various cells, insulated from each other, to contain the individual components of the control circuitry. The P-type region 127 is connected to the buried collector region 109 and forms a deep collector contact region of the PNP power transistor. The P-type regions 109, 127 delimit a portion 130 of the epitaxial layer N which contains the base region of the same PNP power transistor.

By similar techniques of implantation (or alternatively by a deposition process) and diffusion, N-type regions are then formed and extend into the epitaxial layer 118. In particular, the N-type region 133 extends to the corresponding buried collector region 112 to form a deep collector contact of the vertical NPN signal transistor, while the N-type region 136 extends to the corresponding buried base region 115 to form a deep base contact of the lateral PNP signal transistor.

P-type regions are then implanted and diffused by similar techniques. The P-type region 139 forms the base region of the vertical NPN signal transistor, and the P-type regions 142 and 145 form, respectively, the collector and emitter regions of the lateral PNP signal transistor. The P-type region 148, formed within the portion 130 of the epitaxial layer, forms the emitter region of the PNP power transistor.

This final phase is also used to form highly doped P-type regions, or enriched regions, which facilitate surface electrical contact. In particular, the P-type region 151 forms an enrichment region for contact with the region 121 which forms the insulation region 106, 121 for the pocket 124 in which the control circuitry is formed. The P-type region 154 forms an enrichment region for the deep collector contact region 127 of the PNP power transistor.

Finally, further high-concentration N-type regions are formed by implantation and diffusion. In particular, the N-type region 157 forms the emitter region of the vertical NPN signal transistor.

In this phase, N-type enrichment regions are also formed which facilitate surface electrical contact, preventing the formation of a P-N junction between an N-type region and a corresponding metal (generally aluminum) track. In particular, the N-type region 160 is an enrichment region for the deep collector contact region 133 of the vertical NPN signal transistor and the N-type region 163 is an enrichment region for the deep base contact region 136 of the lateral PNP signal transistor. Similarly, the N-type region 166 is an enrichment region for the portion 130 of epitaxial layer containing the base region of the PNP power transistor.

Metal tracks which are in contact with surface areas of the various components are then formed, by known techniques of deposition, masking and attachment, on the front surface of the chip, which is covered with an insulating layer 169 (typically silicon dioxide). In particular, the metal track 172 forms a terminal for the insulation region 106, 121, 151. The metal tracks 175, 178 and 181 form the collector, base and emitter terminals respectively of the vertical NPN signal transistor. The metal tracks 184, 187 and 190 form the collector, base and emitter terminals respectively of the lateral PNP signal transistor. Finally the metal tracks 193, 196 and 199 form the collector, base and emitter terminals respectively of the PNP power transistor.

By keeping the P-type region 109, 127, 154 at a potential lower than that of the surrounding N-type semiconductor material 103, 118, so that the corresponding P-N junction is reverse biased, the PNP power transistor formed in this way is fully insulated electrically from the rest of the chip. In the structure according to the present invention, it is therefore possible to form a plurality of fully insulated PNP power transistors (only one of which is shown in the figure) integrated on the same chip with a plurality of independent outputs consisting of the corresponding collector terminals.

Each PNP power transistor formed according to the present invention has a vertical current conducting structure, with a breakdown voltage greater than that of the devices according to the known art. Typically, each PNP power transistor has a collector-base, open emitter breakdown voltage of more than 200 V.

Persons skilled in the art will realize that the structure according to the present invention also has the advantage of using a single epitaxial layer, with consequent simplicity of the corresponding manufacturing process. Preferably, as shown in the figure, the portion 130 of epitaxial layer containing the base region of the PNP power transistor comprises a further buried N-type region 116 which forms a junction with the buried P-type region 109. This buried region 116 is formed during the same phase as the buried regions 112 and 115. This region 116 enriches the base region (portion 130 of the epitaxial layer) of the PNP power transistor to a greater extent with N-type impurities. The higher doping level of the base region reduces the extension of the depletion layer inside this region, avoiding the phenomenon of punch-through towards the emitter of the PNP power transistor. It should be noted that the gain of the PNP power transistor is reduced by increasing the doping of its base region. It is therefore possible to adjust the gain of the PNP power transistor by varying the extent of doping of the region 116.

Figure 2:
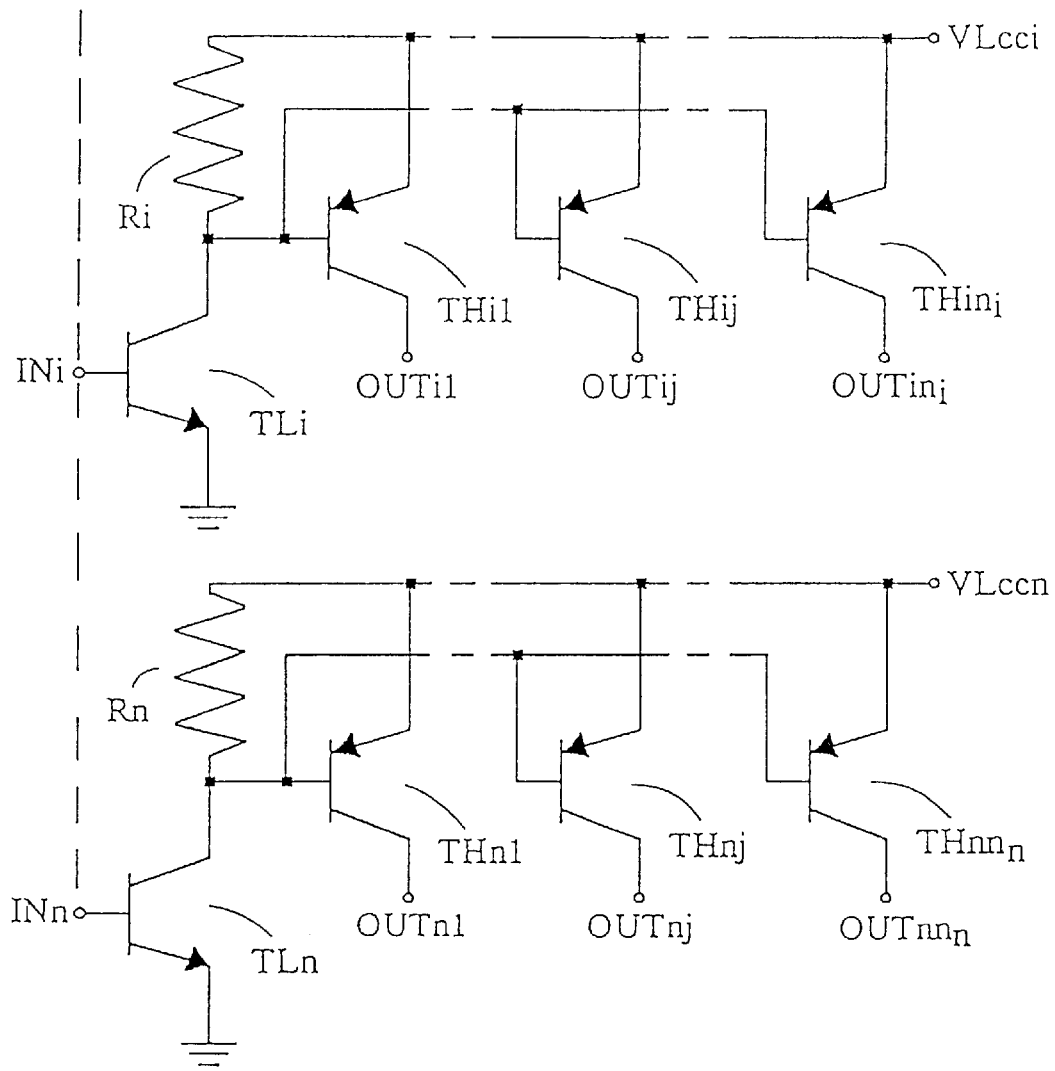
FIG. 2 shows the equivalent electrical diagram of a circuit formed with the use of the structure shown in FIG. 1.

The equivalent electrical diagram of a circuit formed with the use of the structure according to FIG. 1 is shown in FIG. 2. The circuit shown in the figure comprises n NPN signal transistors, each of which is supplied from a suitable low-voltage power source through a corresponding resistor. Each of the NPN signal transistors drives various PNP power transistors supplied from the same low-voltage power source.

In particular, the generic NPN signal transistor TLi has an input terminal INi consisting of its base terminal. The emitter terminal of the transistor TLi is connected to the earth terminal, while the collector terminal is connected to the first terminal of a resistor Ri. The second terminal of the resistor Ri is connected to a low-voltage power supply terminal VLcci.

Each low-voltage transistor TLi drives $n_i$ PNP power transistors. In particular, the generic PNP power transistor THij has its base terminal connected to the collector terminal of the transistor TLi, while the emitter terminal is connected to the low-voltage power supply terminal VLcci. The PNP power transistor THij has an output terminal OUTij consisting of its collector terminal.

By using the structure according to the present invention, it is therefore possible to form on the same chip different power stages, with a plurality of inputs and a plurality of independent outputs.

Figure 3:
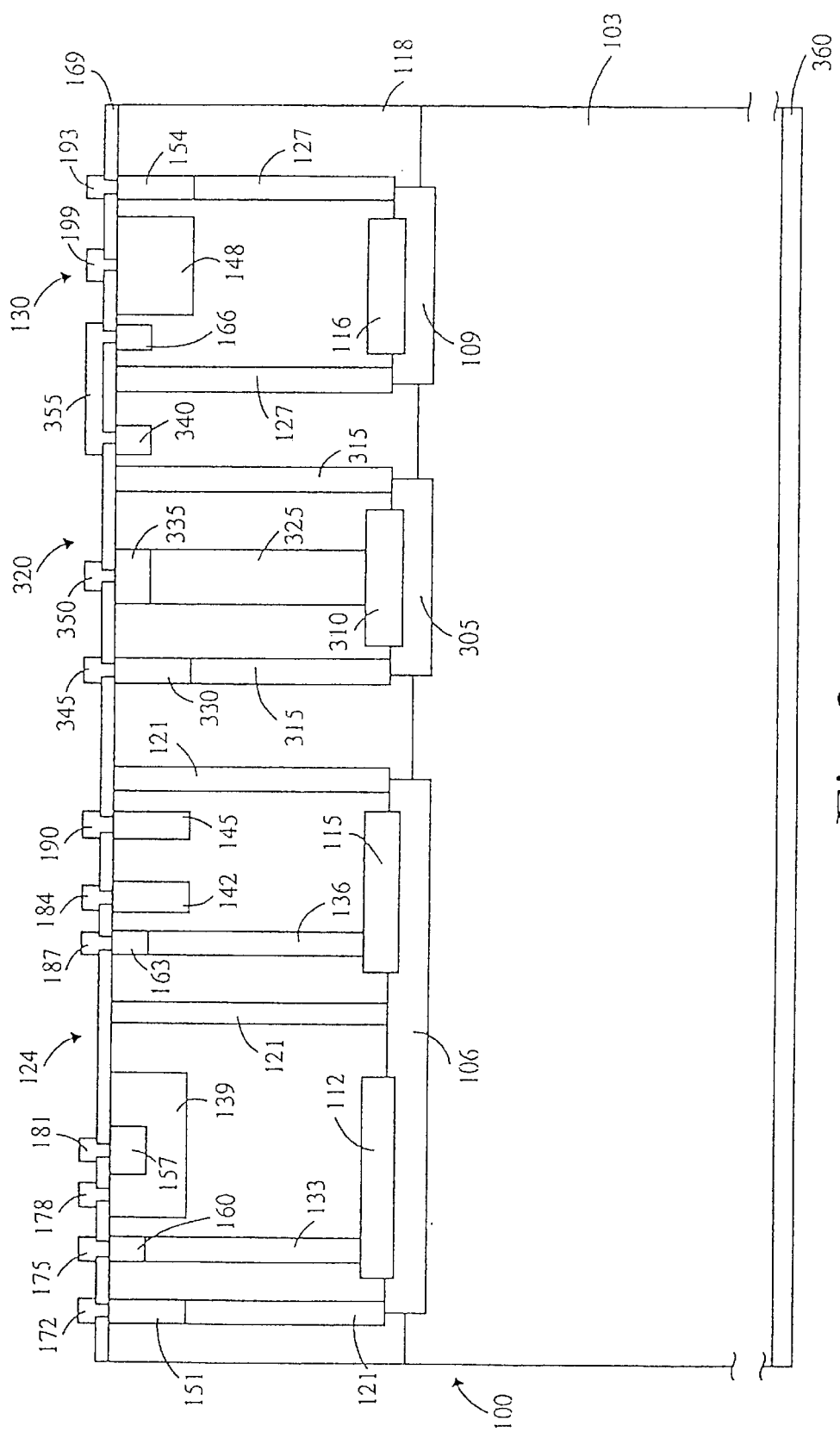
FIG. 3 is a partial schematic sectional view of a different embodiment of the semiconductor device structure according to the present invention.

With reference to FIG. 3, a partial schematic sectional view is provided of a different embodiment of the semiconductor device structure according to the present invention. The structure shown in the figure is formed by the same process phases as those described above and the elements in common with the structure shown in FIG. 1 are identified by the same reference numbers.

The structure shown in FIG. 3 also comprises a vertical NPN power transistor used to drive one or more PNP power transistors. In detail, during the phases of formation of the buried P-type and N-type regions, a P-type region 305, which forms an buried base region of the NPN power transistor, is formed on the surface of the substrate 103 by implantation and subsequent diffusion, and an N-type region 310, which forms an buried emitter region of the NPN power transistor, is formed on the P-type region 305.

During the phase of formation of the P deep contact regions 121 and 127, a P-type region 315, which passes through the epitaxial layer 118 to the buried base region 305 and forms a deep base contact region of the NPN power transistor, is implanted and diffused. The P-type region 305, 315 delimits a portion 320 of the epitaxial layer N which contains the emitter region of the NPN power transistor. The portion of semiconductor material between the P-type region 305, 315 and the lower surface of the chip contains the collector region of the NPN power transistor.

By similar techniques of implantation (or alternatively by a deposition process) and diffusion, an N-type region 325 is then formed and extends into the epitaxial layer and is connected to the corresponding buried emitter region 310 to form a deep emitter contact of the NPN power transistor. This region 315 is formed at the same time as the regions 133 and 136.

During the phase of formation of the enrichment regions 151 and 154, a highly doped P-type region 330 is formed and defines an enrichment region for the deep base contact region 315 of the NPN power transistor. Similarly, an enrichment region 335 for the deep base contact region 325 of the NPN power transistor, and an enrichment region 340 to facilitate surface electrical contact with the epitaxial layer 118 and consequently with the collector region of the NPN power transistor are formed during the phase of formation of the enrichment regions 160, 163 and 166.

Metal tracks 345 and 350 which form the base and emitter terminals respectively of the NPN power transistor are then formed during the phase of metal coating of the upper surface of the chip. A further metal track 355 electrically connects the portion of epitaxial layer 130 (and consequently the base region of the PNP power transistor) to the epitaxial layer 118 (and consequently to the collector region of the NPN power transistor) through the corresponding enriched regions 166 and 340. A metal layer 360, forming the collector terminal of the NPN power transistor, is formed on the bottom of the chip, in other words, on the free surface of the substrate 103.

As in the preceding case, in a structure of the type described above it is possible to form a plurality of fully insulated PNP power transistors (only one of which is shown in the figure) by reverse biasing the P-N junction formed between the P-type region 109, 127, 154 of each individual PNP power transistor and the surrounding N-type semiconductor material 103, 118. One or more of the PNP power transistors may then be connected electrically to the NPN power transistor (through the metal track 355).

Figure 4:
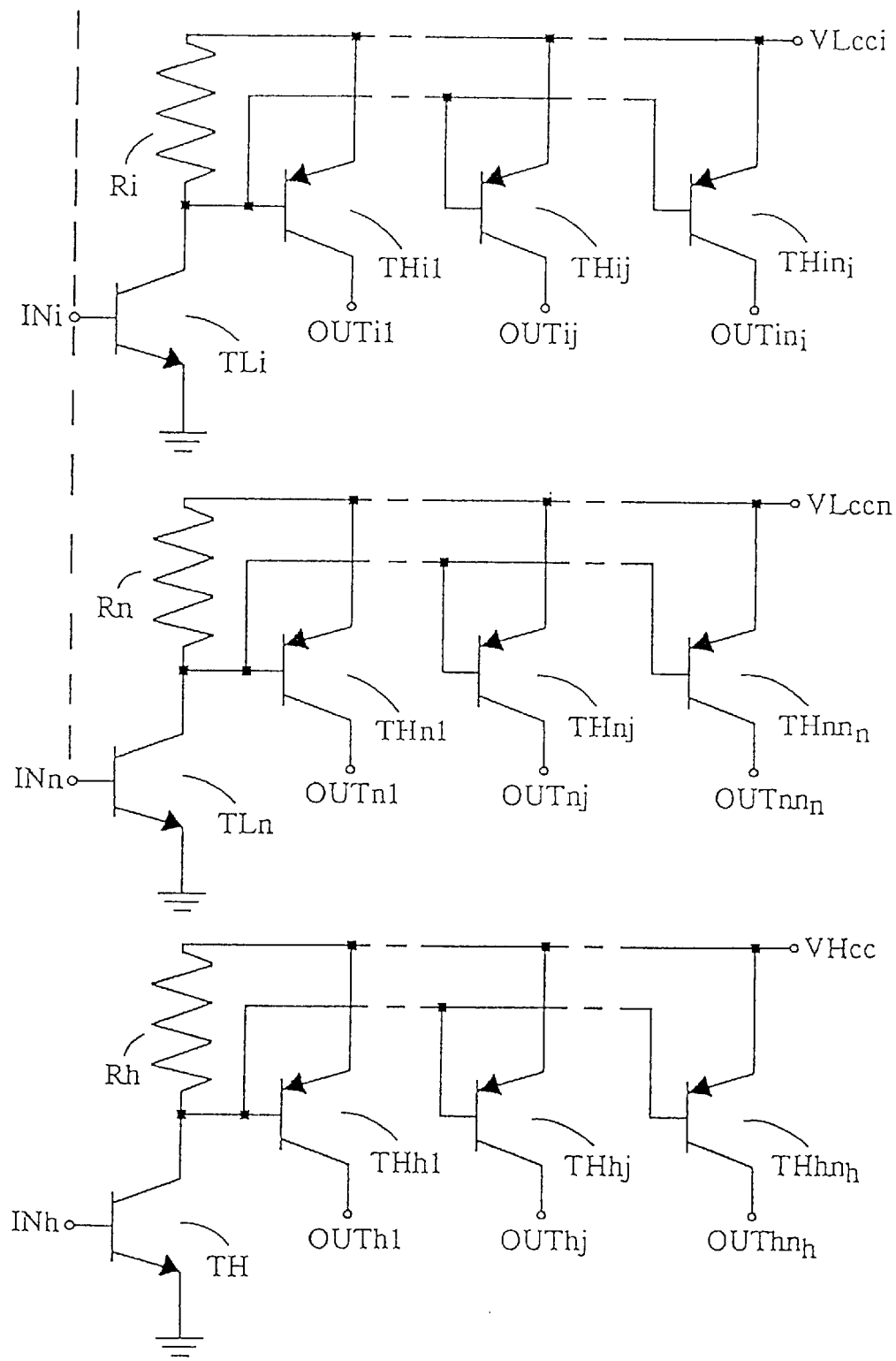
FIG. 4 shows the equivalent electrical diagram of a circuit formed with the use of the structure shown in FIG. 3.

The equivalent electrical diagram of a circuit formed by using the structure according to FIG. 3 is shown in FIG. 4. As in the preceding case, the circuit shown in the figure comprises n power stages, each of which is driven by an NPN signal transistor supplied from a suitable low-voltage power source.

The circuit formed by using the structure according to FIG. 3 includes a further power stage comprising an NPN power transistor and supplied from a suitable high-voltage power source through a corresponding resistor. The NPN power transistor drives one or more PNP power transistors supplied from the same high-voltage power source.

In particular, the NPN power transistor TH has an input terminal INh consisting of its base terminal. The emitter terminal of the transistor TH is connected to the earth terminal, while the collector terminal is connected to the first terminal of a resistor Rh. The second terminal of the resistor Rh is connected to a high-voltage power supply terminal VHcc.

The high-voltage transistor TH drives $n_h$ PNP power transistors. In particular, the generic PNP power transistor THhj has its base terminal connected to the collector terminal of the transistor TH, while the emitter terminal is connected to the high-voltage power supply terminal VHcc. The PNP power transistor THhj has an output terminal OUThj consisting of its collector terminal. This embodiment of the present invention therefore has the further advantage of providing a power stage with a plurality of independent outputs and with an input consisting of a power transistor, therefore enabling a high power supply voltage to be used.

What is claimed is:

1. A method for making a power semiconductor device structure comprising at least one PNP power transistor and control circuitry therefor, the method comprising:

forming first and second P-type regions in an N-type substrate to define first and second buried regions;

growing an N-type epitaxial layer on the substrate so that the first and second buried regions are at an interface defined between the substrate and the epitaxial layer;

forming a first P-type contact region in the epitaxial layer and extending downwardly to the first buried region so that the first buried region, the first contact region and an upper surface of the epitaxial layer delimit a first portion of the epitaxial layer containing the control circuitry;

forming a second P-type contact region in the epitaxial layer and extending downwardly to the second buried region so that the second buried region, the second contact region and the upper surface of the epitaxial layer delimit a second portion of the epitaxial layer; and forming a third P-type region in the epitaxial layer extending downwardly into and in direct contact with an interior of the second portion of the epitaxial layer;

whereby the second buried region and the second contact region, the second portion of the epitaxial layer, and the third region define respective collector, base, and emitter regions of the at least one PNP power transistor.

2. A method according to claim 1, further comprising:

forming a fourth P-type region in the N-type substrate to define a third buried region at an interface defined between the substrate and the epitaxial layer;

forming a third P-type contact region in the epitaxial layer extending downwardly to the third buried region;

the fourth region and the upper surface of the epitaxial layer delimit a third portion of the epitaxial layer;

forming in the third portion of the epitaxial layer a fourth buried N-type region forming a junction with the third buried region;

forming a fourth contact region in the epitaxial layer extending downwardly to the fourth buried region;

a predetermined portion of the epitaxial layer lying between the fourth region and the substrate;

the predetermined portion of the epitaxial layer, the fourth region, and the third portion of the epitaxial layer define respective collector, base, and emitter regions of an NPN power transistor; and electrically connecting the collector region of the NPN power transistor and the base region of the at least one PNP power transistor.

3. A method according to claim 2, wherein electrically connecting comprises forming a metal conductor electrically connecting an upper surface of the second portion of the epitaxial layer with the predetermined portion of the epitaxial layer.

4. A method according to claim 1, further comprising forming a fifth buried N-type region in the second portion of the epitaxial layer for forming a junction with the second buried region.

5. A method for making a power semiconductor device structure comprising at least one power transistor and control circuitry therefor, the method comprising:

forming first and second regions of second conductivity type into a substrate of first conductivity type to define first and second buried regions;

growing an epitaxial layer of first conductivity type on the substrate so that the first and second buried regions are at an interface defined between the substrate and the epitaxial layer;

forming a first contact region of second conductivity type in the epitaxial layer extending downwardly to the first buried region so that the first buried region, the first contact region and an upper surface of the epitaxial layer delimit a first portion of the epitaxial layer containing the control circuitry;

forming a second contact region of second conductivity type in the epitaxial layer extending downwardly to the second buried region so that the second buried region, the second contact region and the upper surface delimit a second portion of the epitaxial layer; and forming a third region of second conductivity type extending downwardly from the upper surface of the epitaxial layer into and in direct contact with an interior of the second portion of the epitaxial layer;

whereby the second buried region and the second contact region, the second portion of the epitaxial layer, and the third region define respective collector, base, and emitter regions of the at least one first power transistor.

6. A method according to claim 5, further comprising:

forming a fourth region of second conductivity type into the substrate to define a third buried region at an interface defined between the substrate and the epitaxial layer;

forming a third contact region of second conductivity type in the epitaxial layer extending downwardly to the third buried region;

the fourth region and the upper surface of the epitaxial layer delimit a third portion of the epitaxial layer;

forming in the third portion of the epitaxial layer a fourth buried region of first conductivity type forming a junction with the third buried region;

forming a fourth contact region of second conductivity type in the epitaxial layer extending downwardly to the fourth buried region;

a predetermined portion of the epitaxial layer lying between the fourth region and the substrate;

the predetermined portion of the epitaxial layer, the fourth region, and the third portion of the epitaxial layer define respective collector, base, and emitter regions of a second power transistor; and electrically connecting the collector region of the second power transistor and the base region of the at least one first power transistor.

7. A method according to claim 6, wherein electrically connecting comprises forming a metal conductor electrically connecting an upper surface of the second portion of the epitaxial layer with the predetermined portion of the epitaxial layer.

8. A method according to claim 5, further comprising forming a fifth buried region of first conductivity type in the second portion of the epitaxial layer for forming a junction with the second buried region.

9. A method according to claim 5 wherein the first conductivity type is N-type; and wherein the second conductivity type is P-type.

* * * * *